(12) United States Patent
Ivanov

(10) Patent No.: US 7,408,392 B2
(45) Date of Patent: Aug. 5, 2008

(54) PWM-TO-VOLTAGE CONVERTER CIRCUIT AND METHOD

(75) Inventor: Mikhail Ivanov, Erlangen (DE)

(73) Assignee: Texas Instruments Deutschland GmbH, Freising (DE)

( * ) Notice: Subject to any disclaimer, the term of this patent is extended or adjusted under 35 U.S.C. 154(b) by 76 days.

(21) Appl. No.: 11/535,575

(22) Filed: Sep. 27, 2006

(65) Prior Publication Data

US 2007/0076792 A1     Apr. 5, 2007

(30) Foreign Application Priority Data

Sep. 30, 2005    (DE) ................. 10 2005 047 031

(51) Int. Cl.
*H03K 3/017*     (2006.01)
(52) U.S. Cl. ..................... 327/172; 327/100
(58) Field of Classification Search ................. None
See application file for complete search history.

(56) References Cited

U.S. PATENT DOCUMENTS

| | | | | |
|---|---|---|---|---|
| 6,208,280 | B1 * | 3/2001 | Baker et al. ................. | 341/152 |
| 6,456,051 | B2 * | 9/2002 | Darzy ......................... | 323/284 |
| 6,844,710 | B2 * | 1/2005 | Lipcsei et al. ............... | 323/284 |
| 7,342,385 | B2 * | 3/2008 | Capodivacca et al. ....... | 323/272 |

FOREIGN PATENT DOCUMENTS

EP    0734123    9/1996

* cited by examiner

*Primary Examiner*—Cassandra Cox
(74) *Attorney, Agent, or Firm*—Warren L. Franz; Wade J. Brady, III; Frederick J. Telecky, Jr.

(57) ABSTRACT

A converter circuit and method for converting a pulse-width modulated input signal into a voltage output signal eliminates an offset due to component mismatch. The converter circuit includes at least two channels. Each channel has an operational amplifier with differential inputs and differential outputs. A first capacitor in each channel provides a negative feedback from a first output to a first input and a second capacitor in each channel provides a negative feedback from a second output to a second input. Each channel is conditioned by a switch array in response to the pulse-width modulated signal to operate in a selected one of an integration mode, a sampling mode and a reset mode. In each channel, in the integration mode, the switch array selectively connects the reference current source of first polarity either to the first or to the second input of the operational amplifier, and the reference current source of second polarity to the other of the first and second inputs. In the sampling mode, the switch array selectively disconnects the reference current sources of first and second polarity and the outputs of the operational amplifier provide the voltage output signal. In the reset mode, the switch array selectively disconnects the reference current sources of first and second polarity and short-circuits the first and second capacitors.

10 Claims, 5 Drawing Sheets

PWM-TO-VOLTAGE CONVERTER CIRCUIT AND METHOD

The invention relates to a converter circuit and method for converting a pulse-width modulated input signal into a voltage output signal.

BACKGROUND

In some systems a signal value is encoded in the time domain using a pulse-width modulation (PWM). Typically, a duty-cycle <50% represents a negative value and a duty-cycle >50% represents a positive value. A conventional way to convert a pulse-width modulated signal to an analog voltage signal is to use filters that introduce delays and phase shift, and require large value RC components that cannot be implemented in an integrated circuit. Other approaches are to use a fast oversampling clock to count the PWM time difference or to use a switched-capacitor filter.

SUMMARY

The invention provides a converter circuit for converting a pulse-width modulated input signal into a voltage output signal which is easy to implement in an integrated circuit and which eliminates an offset due to component mismatch. Specifically, the converter circuit of the invention has at least two similar channels. Each channel has an operational amplifier with differential inputs and differential outputs. A first capacitor in each channel provides a negative feedback from a first output to a first input, and a second capacitor in each channel provides a negative feedback from a second output to a second input. Each channel is conditioned by a controlled switch array in response to the PWM signal to operate in an integration mode, a sampling mode or a reset mode.

For each channel, in the integration mode, the switch array selectively connects the reference current source of first polarity either to the first or to the second input of the operational amplifier, and connects the reference current source of second polarity to the other of the first and second inputs. In the sampling mode, the switch array selectively disconnects the reference current sources of first and second polarity, and the outputs of the operational amplifier provide the voltage output signal. In the reset mode, the switch array selectively disconnects the reference current sources of first and second polarity and short-circuits the first and second capacitors.

The inventive converter circuit is based on the principle of integrating currents of opposite polarity across a capacitor. Under ideal conditions, this yields a true linear relationship between the duty-cycle of the PWM input signal and the analog voltage output signal, with circuit components that can be easily implemented in an integrated circuit.

In a preferred embodiment, the average of the voltage outputs of two successive periods of the PWM input signal is formed. Specifically, the first and second channels of the channel pair are operated so that, in a current period of the pulse-width modulated input signal and while the input signal is in the first level condition, the first channel operates in integration mode with the reference current source of first polarity connected to the first input and the reference current source of second polarity connected to the second input, and the second channel operates in sampling mode. In the current period of the pulse-width modulated input signal and while the input signal is in the second level condition, the first channel operates in integration mode with the reference current source of second polarity connected to the first input and the reference current source of first polarity connected to the second input, and the second channel operates in reset mode. In a subsequent period of the pulse-width modulated input signal and while the input signal is in the first level condition, the first channel operates in sampling mode and the second channel operates in integration mode with the reference current source of second polarity connected to the first input and the reference current source of first polarity connected to the second input. In the subsequent period of the pulse-width modulated input signal and while the input signal is in the second level condition, the first channel operates in reset mode and the second channel operates in integration mode with the reference current source of first polarity connected to the first input and the reference current source of second polarity connected to the second input.

As can be demonstrated by a straightforward calculation, this embodiment of the invention permits a total cancellation of the system offset. Although current mismatches and amplifier offset introduce a gain error, the gain error as part of the feedback loop gain is not critical. The critical parameter in the PWM processing is the system offset, which can be totally cancelled by the invention.

In an embodiment where a continuous voltage output is desired, the converter circuit comprises three similar channels. The first, second and third channels are controlled by the switch array so that, at each time, one channel operates in the integration mode, one channel operates in the sampling mode, and one channel operates in the reset mode.

A further improvement in terms of mismatch cancellation is achieved with an embodiment wherein, from a period of the pulse-width modulated signal in which a channel works in the integration mode to a next one, the order in which the first and second inputs of the differential amplifier in the channel are connected to the reference current sources is inverted.

The control signals for the switch array are conveniently supplied by a state machine with an input to which the pulse-width modulated signal is applied and a plurality of switch control outputs each connected to control an associated switch in the switch array.

BRIEF DESCRIPTION OF THE DRAWINGS

Further advantages and details of the invention will appear from the following description of the principles and of a preferred embodiment, with reference to the accompanying drawings, wherein.

DETAILED DESCRIPTION OF THE EMBODIMENTS

Figure 1A:
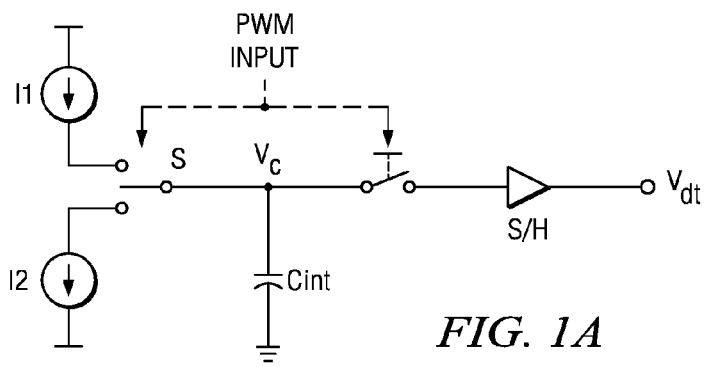
FIG. 1A is a basic circuit diagram illustrating the underlying principle of the invention.

With reference to FIG. 1A, the basic concept of the invention is to integrate currents of like amount and opposite polarity across a capacitor. Current source I1 is a current source of a first polarity and current source I2 is a current source of a second polarity. A first switch S selectively connects one of current sources I1 and I2 across an integrating capacitor Cint. A second switch T selectively connects capacitor Cint to the input of a sample-and-hold circuit S/H. Switches S and T are controlled by a PWM input signal, as described below with reference to FIG. 1B.

Figure 1B:
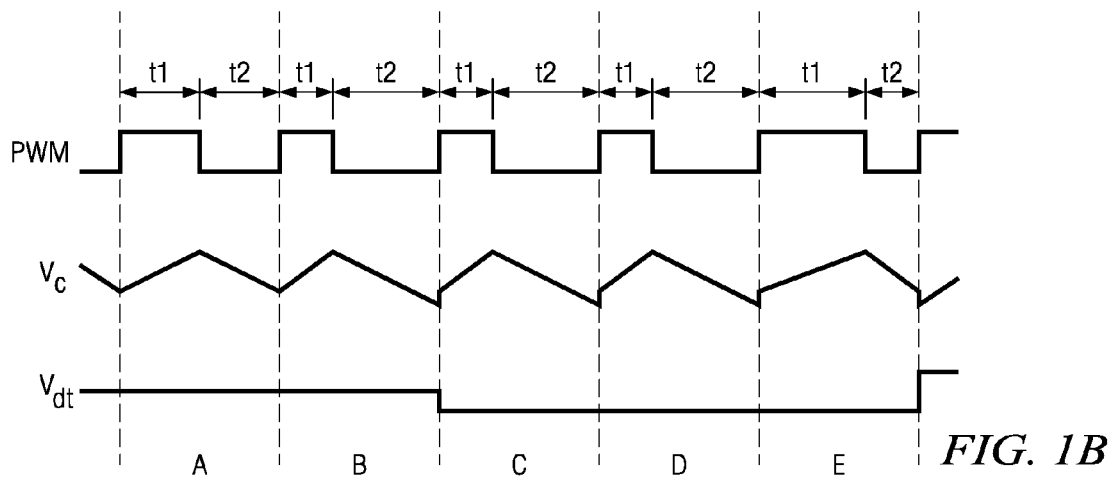
FIG. 1B is a signal diagram illustrating the operation of the circuit in FIG. 1A.

In FIG. 1B, the PWM signal, the voltage Vc at capacitor Cint and the converted output voltage Vdt at the output of sample-and-hold circuit S/H are shown over five periods A-E of the PWM signal. In each period, the PWM signal is in a first predetermined level condition during a time interval t1 and in a second predetermined level condition during a time interval t2. In each interval t1, switch S connects the first current source I1 to capacitor Cint so that the capacitor is charged. In each interval t2, switch S connects the second current source I2 to capacitor Cint so that the capacitor is discharged. At the end of each period, capacitor Cint is discharged.

As assumed in FIG. 1B, the PWM input signal is balanced during the first period A, and the output voltage Vdt is zero. In the second period B, the interval t1 is shorter than interval t2, so the output voltage Vdt assumes a negative value. In the third and fourth periods C and D, the duty-cycle remains constant and the output voltage Vdt remains at the same negative value. In the fourth period E, the interval t1 is longer than the interval t2, so the output voltage Vdt assumes a positive value.

Figure 2:
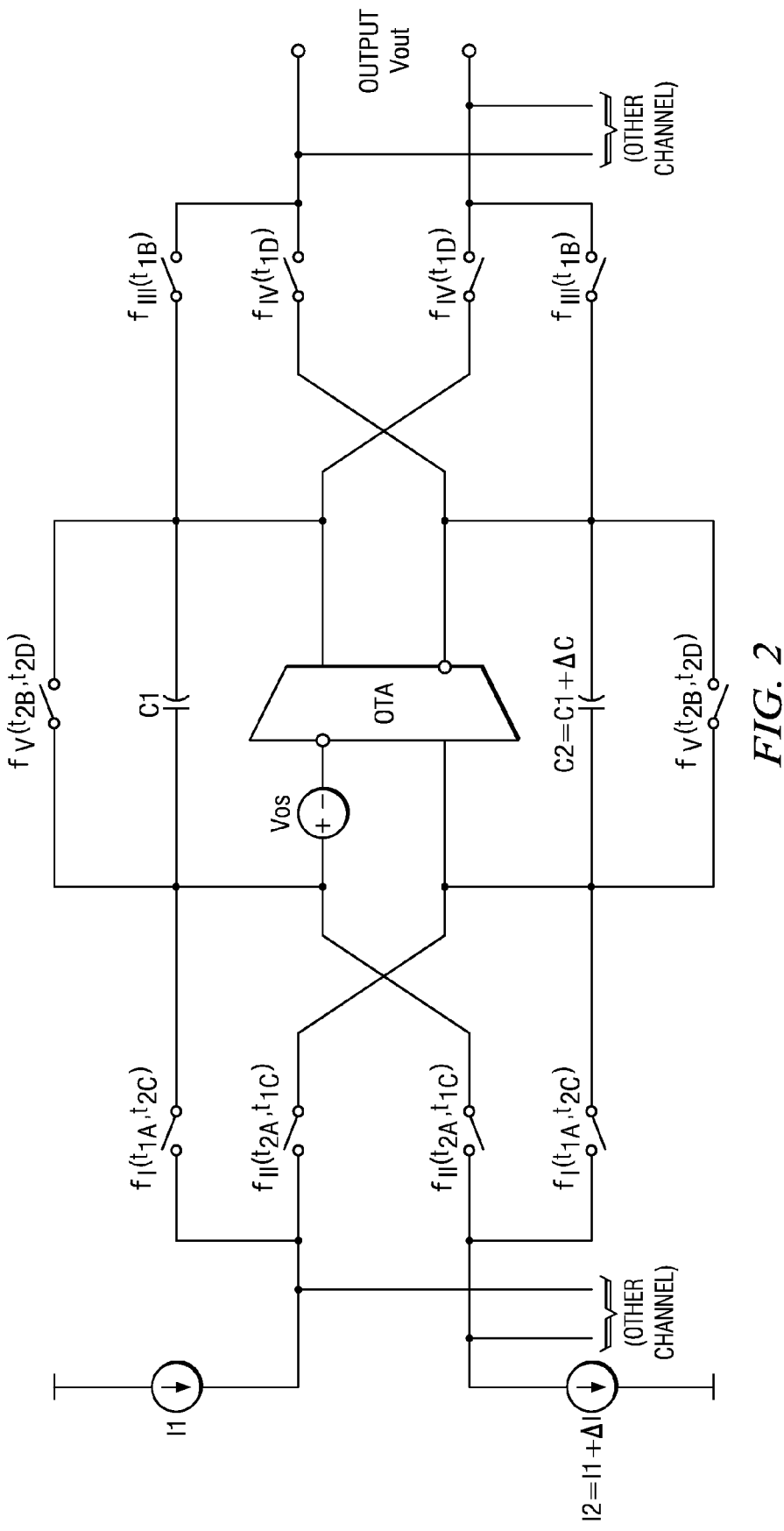
FIG. 2 is a schematic circuit diagram of a PWM-to-voltage converter as used in the invention.

In a practical implementation as shown in FIG. 2, an active integrator circuit is used to reduce the output impedance. In an active integrator, the integrating capacitor is connected across the output and the inverting input of a differential amplifier, providing a negative feedback, and the current source is connected to the inverting input. In the specific embodiment of FIG. 2, a fully differential operational transconductance amplifier OTA is used which has an inverting input, a non-inverting input, an inverted output and a non-inverted output. Since a fully differential amplifier is used, two integrating capacitors C1 and C2 are required, each connecting one of the outputs with a corresponding input of the OTA. The size and configuration of capacitors C1 and C2 are preferably matched to give $C2=C1+\Delta C$, with minimum $\Delta C$. Likewise, the size and configuration of current sources I1 and I2 are preferably matched so that, except for polarity, $I2=I1+\Delta I$, with minimum $\Delta I$. A voltage source Vos in the path of the inverting input symbolizes the component deviations at the origin of the amplifier offset. The integrator circuit is successively operated in an integrating mode, a sampling mode and a reset mode.

Figure 3:
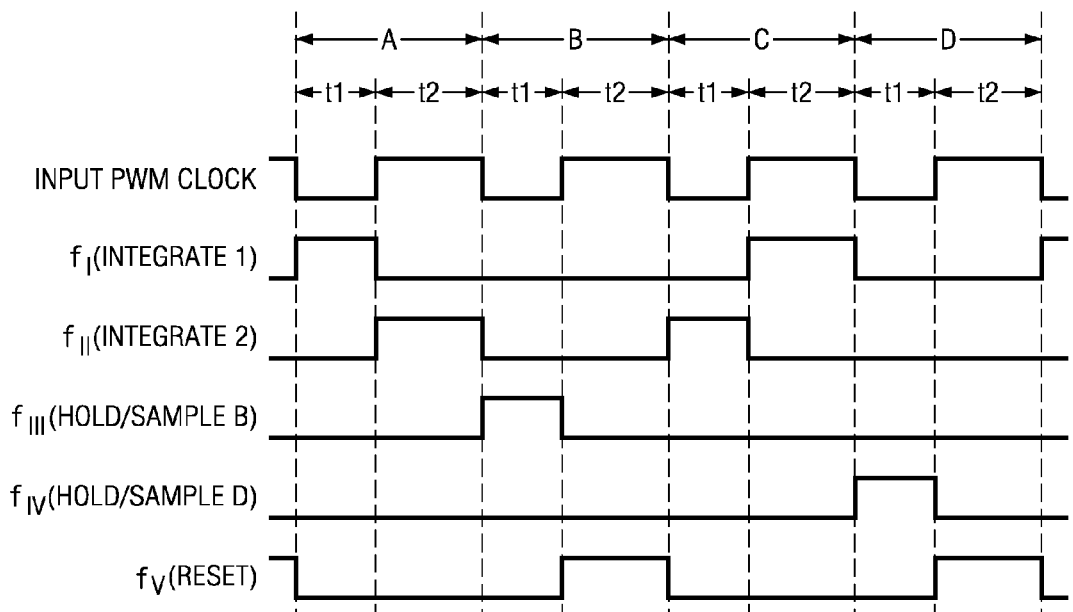
FIG. 3 is a signal diagram illustrating the operation of the circuit in FIG. 2.

Reference is made to FIG. 2 in conjunction with FIG. 3. In FIG. 2, a total of ten switches form a switch array. The switches in the array are denoted as follows: switches $\Phi_I$ and $\Phi_{II}$ are closed in the integrating mode and open otherwise; switches $\Phi_{III}$ and $\Phi_{IV}$ are closed in the sampling mode and open otherwise; and switches $\Phi_V$ are closed in the reset mode and open otherwise. Each switch reference numeral in FIG. 2 is followed by a parenthetical indication of the respective time interval and period of the PWM input signal during which that switch is closed. For example, "$\Phi_I(t_{2A}, t_{1C})$" means that the switch $\Phi_I$ is closed during intervals t2 in period A and t1 in period C, and "$\Phi_{IV}(t_{1D})$" means that the switch $\Phi_{IV}$ is closed during the interval t1 in period D.

Accordingly, in operation during the integrating mode, the current sources I1 and I2 are respectively connected to the inverting and non-inverting inputs of the OTA during intervals t2 of period A and t2 of period C, and to the non-inverting and inverting inputs of the OTA during the intervals t2 of period A and t2 of period C. This is the integrating mode.

During interval t1 of period B and interval t1 of period D, both current sources are disconnected, and the inverted and non-inverted outputs of the OTA are applied to the system output, with the connections of the outputs of the OTA exchanged between the two intervals. This is the sampling mode. During interval t2 of period B and interval t2 of period D, both current sources are still disconnected, and capacitors C1 and C2 are each short-circuited while both outputs of the OTA are also disconnected. This is the reset mode.

Figure 4A:
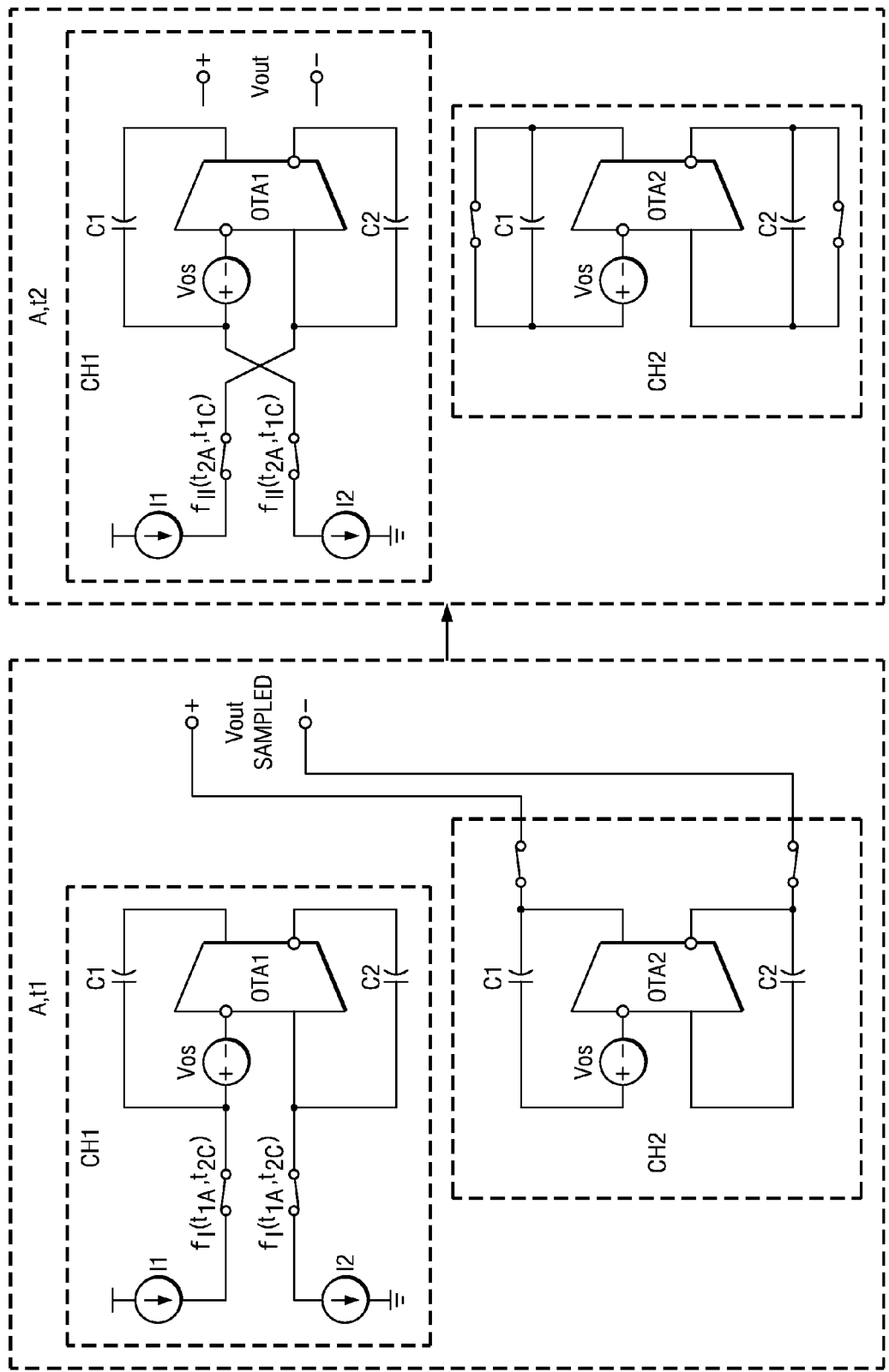
FIG. 4A shows a two-channel implementation of the PWM-to-voltage converter in one period of the PWM signal.
Figure 4B:
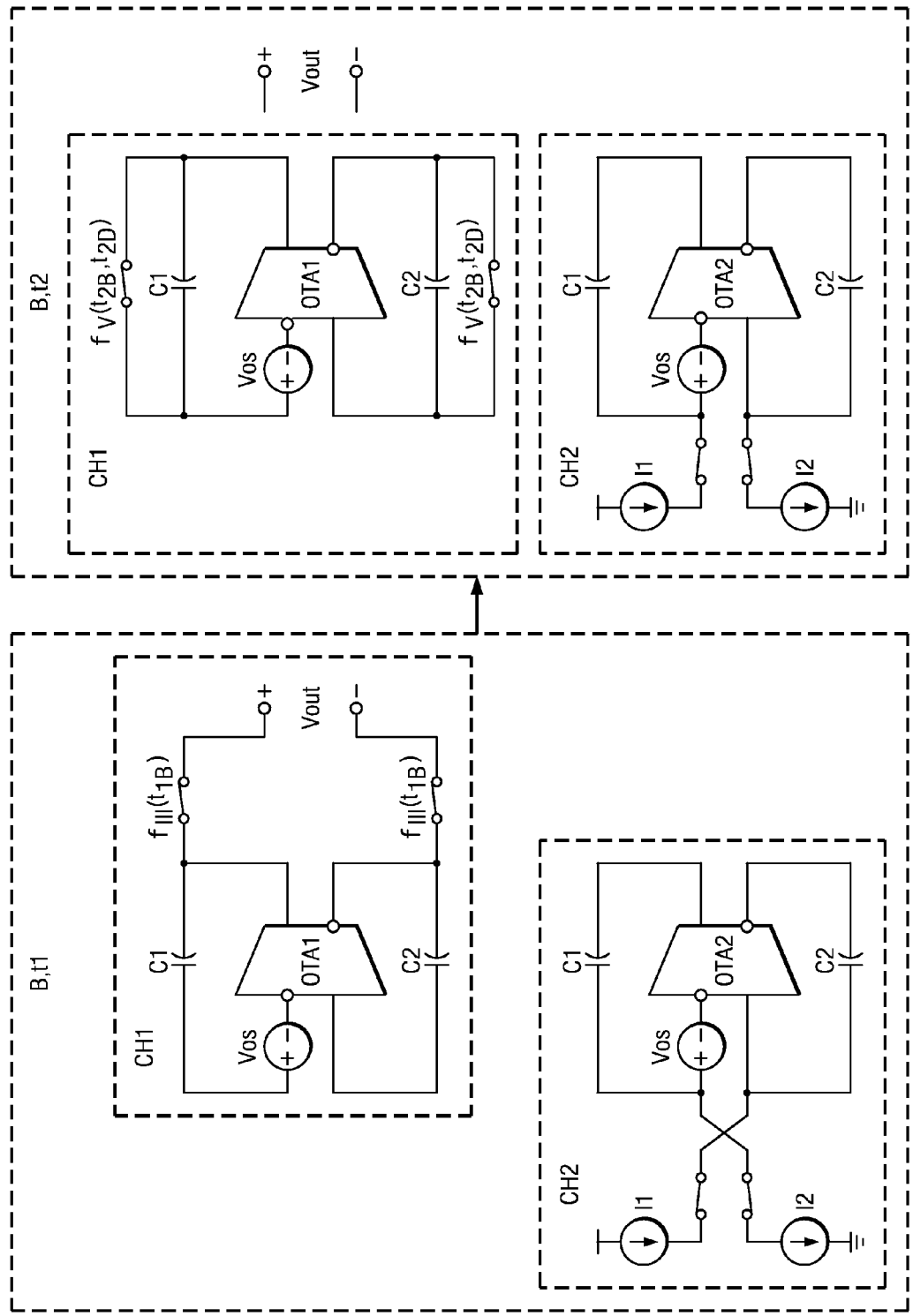
FIG. 4B shows a two-channel implementation of the PWM-to-voltage converter in a subsequent period of the PWM signal.

With reference now to FIGS. 4A and 4B, a circuit arrangement with two similar channels CH1, CH2 is shown, wherein each channel CH1, CH2 generally corresponds to the converter circuit shown in FIG. 2. In FIGS. 4A and 4B, similar reference numerals are used to designate elements analogous to those of FIG. 2, but the two current sources I1 and I2 are shared between the two channels CH1, CH2. The fully differential operational transconductance amplifier is designated as OTA1 in the first channel and as OTA2 in the second channel. Both channels CH1, CH2 also share a common output Vout. The switches $\Phi_I$, $\Phi_{II}$, $\Phi_{III}$, $\Phi_{IV}$ and $\Phi_V$ of the respective switch arrays of the channels CH1, CH2 are controlled to close at different times, so that one channel may operate in one mode, while the other operates in a different mode.

In FIG. 4A, circuit block "A, t1" shows the two channels in a condition wherein channel 1 operates in an "integrate up" condition, with current source I1 connected to the inverting input of OTA1 and current source I2 connected to the non-inverting input of the OTA1; and wherein channel 2 operates in a "hold" condition with the outputs of OTA2 connected to the system output Vout. Circuit block "A, t2" in FIG. 4A shows the channels in a condition wherein channel 1 operates in an "integrate down" condition, with current source I2 connected to the inverting input of OTA1 and current source I1 connected to the non-inverting input of the OTA1; and wherein channel 2 operates in reset mode with capacitors C1 and C2 are short-circuited.

In FIG. 4B, circuit block "B, t1" shows the two channels in a condition wherein channel 1 operates in a "hold" condition, with the outputs of OTA1 connected to the system output Vout; and wherein channel 2 operates in an "integrate down" mode. Circuit block "B, t2" in FIG. 4B shows the two channels in a condition wherein channel 1 is in the reset mode and wherein channel 2 is in the "integrate up" mode.

Figure 5:
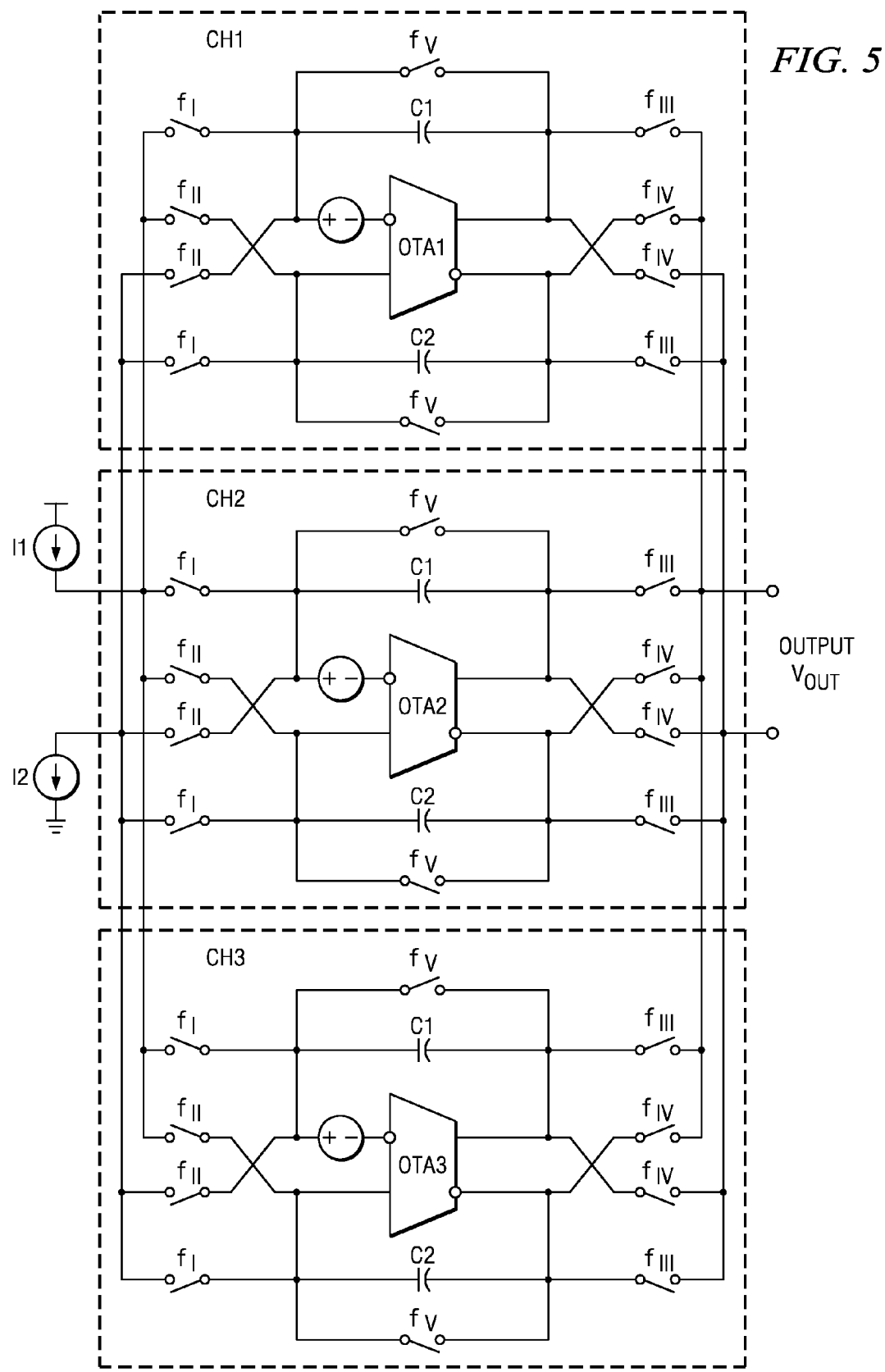
FIG. 5 shows a three-channel implementation of the PWM-to-voltage converter.

FIG. 5 shows an arrangement with three similar channels CH1, CH2 and CH3, each of which generally corresponds to the converter circuit of FIG. 2. The three channels CH1, CH2 and CH3 share common current sources I1 and I2 and a common output Vout. The switches $\Phi_I$, $\Phi_{II}$, $\Phi_{III}$, $\Phi_{IV}$ and $\Phi_V$ of the respective switch arrays of the channels CH1, CH2 and CH3 are controlled to close at different times, during time intervals of the periods chosen so that, at any one time, one channel operates in the integration mode, one channel operates in the sampling mode, and one channel operates in the reset mode.

In each of the embodiments shown, appropriately timed control signals for the various switches are required. Care should be taken that conflicting switch conditions are avoided ("break before make"). The switch control signals are preferably generated by a state machine which has an input to which the PWM signal is applied and a plurality of outputs each associated with one of the switches in the switch array of the converter circuit.

Those skilled in the art to which the invention relates will appreciate that additions, deletions, substitutions and modifications may be made to the described embodiments, and that many and various other embodiments may be implemented, within the scope of the claimed invention.

What is claimed is:

1. A converter circuit for converting a pulse-width modulated input signal into a voltage output signal, comprising:
   a reference current source of a first polarity;
   a reference current source of a second, opposite polarity;
   a switch array controlled in response to the pulse-width modulated input signal; and
   a pair of channels, each with an operational amplifier that has differential inputs and differential outputs, a first capacitor in each channel connected for providing a negative feedback from a first output to a first input, and a second capacitor in each channel connected for providing a negative feedback from a second output to a second input;
   wherein each channel of the pair is configured and adapted to be conditioned by the switch array to be selectively operated in an integration mode, a sampling mode or a reset mode; so that, for each channel, in the integration mode, the switch array selectively connects the reference current source of first polarity either to the first or to the second input of the operational amplifier, and connects the reference current source of second polarity to the other of the first and second inputs; in the sampling mode, the switch array selectively disconnects the reference current sources of first and second polarity, and the outputs of the operational amplifier provide the voltage output signal; and, in the reset mode, the switch array selectively disconnects the reference current sources of first and second polarity and short-circuits the first and second capacitors.

2. The converter circuit of claim 1, wherein the first and second channels of the channel pair are configured and adapted to be operated so that, in a current period of the pulse-width modulated input signal and while the input signal is in a first level condition, the first channel operates in the integration mode with the reference current source of first polarity connected to the first input and the reference current source of second polarity connected to the second input, and the second channel operates in the sampling mode; in the current period of the pulse-width modulated input signal and while the input signal is in a second level condition, the first channel operates in the integration mode with the reference current source of second polarity connected to the first input and the reference current source of first polarity connected to the second input, and the second channel operates in reset mode; in a subsequent period of the pulse-width modulated input signal and while the input signal is in the first level condition, the first channel operates in the sampling mode and the second channel operates in the integration mode with the reference current source of second polarity connected to the first input and the reference current source of first polarity connected to the second input; and in the subsequent period of the pulse-width modulated input signal and while the input signal is in the second level condition, the first channel operates in the reset mode and the second channel operates in the integration mode with the reference current source of first polarity connected to the first input and the reference current source of second polarity connected to the second input.

3. The converter circuit of claim 2, comprising a third channel similar to the first and second channels, the first, second and third channels being configured and adapted to be controlled by the switch array so that, at each time, one channel operates in the integration mode, one channel operates in the sampling mode and one channel operates in the reset mode.

4. The converter circuit of claim 2, wherein the circuit is further configured and adapted so that, from a period of the pulse-width modulated signal in which a channel works in the integration mode to a next one, the order in which the first and second inputs of the differential amplifier in the channel are connected to the reference current sources is inverted.

5. The converter circuit of claim 1, further comprising a state machine with an input to which the pulse-width modulated signal is applied and a plurality of switch control outputs each connected to control an associated switch in the switch array.

6. A method for converting a pulse-width modulated input signal into a voltage output signal, comprising:
   providing a reference current source of a first polarity;
   providing a reference current source of a second, opposite polarity;
   providing a switch array controlled in response to the pulse-width modulated input signal;
   providing a pair of channels, each with an operational amplifier that has differential inputs and differential outputs, a first capacitor in each channel providing a negative feedback from a first output to a first input, and a second capacitor in each channel providing a negative feedback from a second output to a second input;
   wherein each channel of the pair is conditioned by the switch array to be selectively operated in an integration mode, a sampling mode or a reset mode; so that, for each channel, in the integration mode, the switch array selectively connects the reference current source of first polarity either to the first or to the second input of the operational amplifier, and connects the reference current source of second polarity to the other of the first and second inputs; in the sampling mode, the switch array selectively disconnects the reference current sources of first and second polarity, and the outputs of the operational amplifier provide the voltage output signal; and, in the reset mode, the switch array selectively disconnects the reference current sources of first and second polarity and short-circuits the first and second capacitors.

7. The method of claim 6, wherein the first and second channels of the channel pair are operated so that, in a current period of the pulse-width modulated input signal and while the input signal is in a first level condition, the first channel operates in the integration mode with the reference current source of first polarity connected to the first input and the reference current source of second polarity connected to the second input, and the second channel operates in the sampling mode; in the current period of the pulse-width modulated input signal and while the input signal is in a second level condition, the first channel operates in the integration mode with the reference current source of second polarity connected to the first input and the reference current source of first polarity connected to the second input, and the second channel operates in reset mode; in a subsequent period of the pulse-width modulated input signal and while the input signal is in the first level condition, the first channel operates in the sampling mode and the second channel operates in the integration mode with the reference current source of second polarity connected to the first input and the reference current source of first polarity connected to the second input; and in the subsequent period of the pulse-width modulated input signal and while the input signal is in the second level condition, the first channel operates in the reset mode and the second channel operates in the integration mode with the reference current source of first polarity connected to the first input and the reference current source of second polarity connected to the second input.

8. The method of claim 7, further comprising providing a third channel similar to the first and second channels, the first, second and third channels controlled by the switch array so that, at each time, one channel operates in the integration mode, one channel operates in the sampling mode and one channel operates in the reset mode.

9. The method of claim 7, wherein the circuit is operated so that, from a period of the pulse-width modulated signal in which a channel works in the integration mode to a next one, the order in which the first and second inputs of the differential amplifier in the channel are connected to the reference current sources is inverted.

10. The method of claim 6, further comprising applying the pulse-width modulated signal as an input to a state machine to provide a plurality of switch control outputs for respectively controlling an associated switch in the switch array.

* * * * *